(12) United States Patent
Wang et al.

(10) Patent No.: US 7,439,009 B2
(45) Date of Patent: Oct. 21, 2008

(54) THREE-DIMENSIONAL OPTICAL DATA STORAGE IN FLUORESCENT DYE-DOPED PHOTOPOLYMER

(75) Inventors: Mark Wang, San Diego, CA (US); Sadik Esener, Solana Beach, CA (US)

(73) Assignee: The Regents of the University of California, Oakland, CA (US)

( * ) Notice: Subject to any disclaimer, the term of this patent is extended or adjusted under 35 U.S.C. 154(b) by 24 days.

(21) Appl. No.: 11/337,741

(22) Filed: Jan. 23, 2006

(65) Prior Publication Data

US 2006/0270755 A1    Nov. 30, 2006

Related U.S. Application Data

(62) Division of application No. 09/547,395, filed on Apr. 11, 2000, now Pat. No. 7,052,812.

(60) Provisional application No. 60/128,989, filed on Apr. 12, 1999.

(51) Int. Cl.
 *G03C 1/72*  (2006.01)
 *G03H 1/04*  (2006.01)

(52) U.S. Cl. .................. 430/281.1; 430/1; 430/2; 430/285.1; 430/286.1; 430/292; 359/3

(58) Field of Classification Search .................. None
See application file for complete search history.

(56) References Cited

U.S. PATENT DOCUMENTS

| | | | |
|---|---|---|---|
| 3,073,699 A * | 1/1963 | Firestine | 430/283.1 |
| 4,864,537 A | 9/1989 | Michl et al. | |
| 5,289,407 A | 2/1994 | Strickler | |
| 5,610,932 A * | 3/1997 | Kessler et al. | 372/39 |

OTHER PUBLICATIONS

"Style Manual" from The American Heritage Dictionary, Second College Edition,Houghton Mifflin Company, Boston, MA, USA, copyright 1982, pp. 55-62.*
RD 288082 ,"Colored dopant", Research Disclosure Journal, Kenneth Mason Publication LTD,, The Book Barn, Westoborne, Hants, United Kingdom, published Apr. 1988, 2 pages, obtained from www.researchdisclosure.com.*
Sutherland, Richard et al., Proc. SPIE-Int. Soc. Opt. Eng (1994), 2152 (Diffractive and Holographic Optics Technology) 303-13, 1994.

* cited by examiner

*Primary Examiner*—Cynthia Hamilton
(74) *Attorney, Agent, or Firm*—Greer, Burns & Crain, Ltd.

(57) ABSTRACT

A host matrix—normally a binder such as cellulose acetate propionate in a solvent such as acetone—contains a radiation-polymerizable photopolymer—normally a monomer like dipentaerythritol pentaacrylate in combination with a crosslinker like 1-vinyl-2-pyrrolidinone, an initiator like N-phenyl glycine, and/or a photosensitizer like camphor quinine—that is initially uniformly doped with a stable dye—typically Rhodamine B and/or Bodipy Red—that photoinitiates photopolymerization. Upon selective exposure of certain regions of the matrix by radiation, most normally laser light radiation, the dye will initially migrate and redistribute itself to radiatively-exposed regions until, dye migration being substantially complete, photopolymerization will occur, locking the migrated dye in place at a relatively higher concentration at the selectively exposed regions. The dye therein stably located can be optically detected by, preferably, light-radiation-stimulated fluorescence. The medium thus serves as an optical memory, including of the volume type, that can be reliably permanently written quickly and inexpensively at high density.

10 Claims, 13 Drawing Sheets

THREE-DIMENSIONAL OPTICAL DATA STORAGE IN FLUORESCENT DYE-DOPED PHOTOPOLYMER

REFERENCE TO RELATED PATENT APPLICATIONS

The present patent application is a division of U.S. application Ser. No. 09/547,395, filed Apr. 11, 2000, now U.S. Pat. No. 7,052,812 which is related to, and claims priority from, U.S. provisional patent application Ser. No. 60/128,989 filed Apr. 12, 1999, for THREE-DIMENSIONAL OPTICAL MEMORY IN FLUORESCENT DYE-DOPED PHOTOPOLYMER to the selfsame inventors as is the present application. The content of the Ser. No. 09/547,395 patent application and the 60/129,989 application is incorporated by reference herein. The present application is related to U.S. patent application Ser. No. 09/547,396, now U.S. Pat. No. 6,501,571 filed on Apr. 11, 2000 for THREE-DIMENSIONAL HOLOGRAPHIC STAMPING OF MULTI-LAYER BIT-ORIENTED NON-LINEAR OPTICAL MEDIA, also to the same inventors. The content of the related patent application is incorporated herein by reference.

BACKGROUND OF THE INVENTION

1. Field of the Invention

The present invention generally concerns optical data storage, optical memories, polymers, multi-layer optical storage, and volume, or 3-D, optical data storage.

The present invention particularly concerns the radiation writing of monolithic multi-layer optical storage media, radiation-written monolithic multi-layer optical storage media, and processes of radiation-induced diffusional re-distribution of molecules within a medium for the purposes of data storage.

2. Description of the Prior Art

Because of the relative economy and high storage capacity of optical media, optical data storage in optical media has proven to be a convenient means for the recording and physical distribution of large quantities of information. However, despite the current search for shorter wavelength lasers and more efficient coding techniques, standard planar optical storage technologies may not be able to keep up with the ever-increasing demand for faster data rate, higher capacity, media.

As a result various new alternatives to optical technologies are currently being investigated. These alternatives include multi-layer reflective media, near-field recording, volume holography, two-photon storage, bit-oriented index modulation, and others. With the exception of near field recording all of these technologies take advantage of the increase in capacity that can be gained by expanding data storage into the third dimension of a thick media.

SUMMARY OF THE INVENTION

The present invention contemplates a new monolithic multi-layer optical storage media in which data may be stored through the diffusional re-distribution of fluorescent molecules within a polymer host.

In accordance with the present invention, the active portion of a radiation-writable media consists of (i) a photopolymer doped with (ii) a dye, preferably a fluorescent dye. The (i) photopolymer becomes selectively polymerized, and/or the (ii) dye—which can be (but need not be), and preferably is, a photoinitiator of photopolymerization—promotes photopolymerization, where and when radiation, normally light radiation is high, most typically at the focal point of a lens, preferably a high numerical aperture lens. The dye molecules bond to the polymer matrix. As they do they become more highly concentrated in the polymerized regions, resulting in a selectively modulated data pattern, or the storage of information.

When the dye is, as is preferable, fluorescent, then the optical readout of stored data is based on detection of fluorescence rather than index modulation as in other photopolymer-based memories. Accordingly the problems of media shrinkage and optical scatter are less of a concern.

An intensity threshold observed in the recording response of this media due to the presence of inhibitor molecules in the photopolymer permits the three-dimensional confinement of recorded bits, and therefore multi-layer recording. The non-linear recording characteristics of this material have been (i) investigated through a simple model of photopolymerization and diffusion, and (ii) verified experimentally. Both single and multiple layer recordings have been demonstrated.

In comparison to the prior art, where changes in volume media have previously been photochemically induced, the present invention offers several advantages. First, molecules within the pre-polymerized, un-exposed, optical medium exhibit such high diffusion and mobility as is, at the initiation of the process, desirable. This high mobility—as opposed to, for example, a solid—makes that constituent components of the volume media can "move around". In the prior art this has been useful so that the components can undergo photo-induced chemical reaction, or photochemistry. In the present invention the mobility is more concerned with the movement of a photo-detectable material, i.e., a dye.

However, when the prior art showed mobility of the constituent components of a volume media, such as in a liquid, this mobility proved troublesome. The same mobility that promoted significant photochemistry made that chemicals and photochemicals, both unchanged and changed, tended to "wander" in the matrix, "greying out" an exposed optical memory and "smearing" such domains (voxels) as are recorded.

However, in the present invention this initial mobility will cease. Initially the dye molecules are drawn to regions of exposure, depleting surrounding regions and increasing contrast. However, over a short period the radiation (light) exposure will cause such spreading polymerization as ultimately locks all constituent components into the positions by then assumed.

This is an essential characteristic, and forte, of the media of the present invention: mobility followed by immobility. After such minor lapse of time as permits all chemicals and photo-chemicals to "move into place" (over molecular dimensions), everything "locks up" and nothing is free to move, essentially forever. This is very beneficial. Effectively nothing changes in a memory once written. The dye can "bleach out" slightly after prolonged exposure to bright light, and/or over millions of radiation interrogations, but is essentially stable, and maintaining of a bright fluorescing capability indefinitely long. The exposed and polymerized radiation memory is essentially just as stable as present (circa 2000) memories of both optical and magnetic types that it serves to replace.

1. A Radiation Recordable Medium

In one of its aspects the present invention concerns an initially homogeneous medium that is suitably selectively differentiated by selective exposure to radiation.

What the medium consists of is rather straightforward: (i) a binder containing a (ii) photopolymer and (iii) a dye.

What transpires within the medium in the event of selective illumination is rather more complex, and requires an explanation based on theory. Although it is well established that theory of operation of an invention is not required for an enabling disclosure, we as inventors hereafter hypothesize and postulate and explain, as best we can, what we think is transpiring.

Notably, it is possible in our theories of our invention to place greater emphasis on certain characteristics, and phenomena, in some versions of our theories than in others. For example, and as will become clearer as our theories are expounded, in some versions of our theory the propensity of the preferred dye to be a photoinitiator of photopolymerization can be integrated into the theory of the invention, while in other, preferred, versions of the theory of the invention this property of the dye can be considered merely incidental, and adjunct, to the main process.

Accordingly, our theories of our invention are not only hypothetical, but capable of being expressed in different words, and with different emphasis on the various component materials and processes. A practitioner of the photochemical arts reading our following theoretical descriptions, and considering the present invention, will thus realize that there are many different ways to describe the underlying phenomena, and that the scope of the present invention should not be unduly limited by arguments concerning the particular words that are variously chosen to express the various theories of the invention. Instead, the process of selective differentiation occurring in the present invention should be understood to broadly encompass the underlying phenomena, howsoever expressed.

2. A Composition of Matter

In a one of its embodiments, the present invention may be shortly, and broadly, be conceived of as a composition of matter selectively permanently differentiable in regions by selective radiation illumination. The composition consists essentially of (i) a monomer photopolymerizable to a polymer (i.e., a photopolymer), and (ii) a dye attaching the polymer. The dye both (i) migrates to, and (ii) is fixed in position at, regions photopolymerized by selective illumination with radiation.

Preferably (but not necessarily), the dye chemically attaches the polymer at these regions.

The composition may further include a binder in which is present the (i) photopolymer, and (ii) the dye.

The dye is preferably fluorescent.

3. A Radiation-Alterable Medium

The expression of the invention within the previous section 1. is—while distinguished from the prior art by the (i) migration, and the (ii) fixation, of a dye—is likely so short as to make it difficult to fully understand, and appreciate, the theorized operation of the invention.

In somewhat greater detail, the present invention may alternatively be considered to be embodied in an initially homogeneous medium that is suitably selectively differentiated by selective exposure to radiation. The medium consists essentially of (i) a binder, containing (ii) a photopolymer, the photopolymer initially substantially homogeneously doped with (iii) a dye that is photoexcitable to bind to photopolymer.

Upon selective exposure of certain regions of the medium by radiation, each of (i) polymerization, (ii) dye migration and (iii) dye fixing will occur. The photopolymerization selectively progressively solidifies the photopolymer. Meanwhile, simultaneously, the dye molecules initially migrate to photopolymerized regions, and are there fixed in position by the photopolymer.

By this coaction a concentration gradient of dye in the matrix from unexposed to exposed regions results. In other words, a concentration gradient results from diffusion of the dye from unexposed to exposed areas.

The initially homogeneous matrix thus becomes selectively differentiated in that dye concentration is increased in exposed areas relative to unexposed areas.

The dye is preferably fluorescent.

The dye may be, but need not be, a photoinitiator of the photopolymerization.

The dye may be, but need not be, fixed in position by the photopolymer by action of chemically attaching the polymer. (It will in any case be mechanically fixed within the polymer.) In some instances—as is the case with the preferred chemical constituents of the invention—the dye chemically attaching the polymer also chemically attaches the monomer. This makes that the dye must, and does, migrate in accompaniment to its attached monomer until, and where, the monomer does photopolymerize to a polymer.

4. A Radiation Recordable Medium

In still yet another of its aspects, the present invention may be considered to be embodied in a medium suitably selectively recorded by radiation.

The medium again consists essentially of (i) a host binder, containing (ii) a liquid monomer, in which molecular mobilities are relatively higher, that is photopolymerized into a solid polymer in which molecular mobilities are relatively lower, the monomer initially substantially homogeneously doped with (iii) a dye that is photoexcitable to bind to at least the polymer.

In terms of the most detailed theory of which we the inventors are possessed, we believe, and have experimental data supporting, that upon selective exposure of certain areas of the medium by radiation, both (i) polymerization and (ii) dye fixing will occur. The monomer undergoes a polymerization process that solidifies the medium. Meanwhile, simultaneously, radiation-exposed and photoexcited dye molecules bind to at least polymer molecules (and normally to the monomer molecules also, although this is not essential).

These dye molecules photoexcited to bind to at least the polymer molecules become, due to the relatively lower molecular mobility in the polymer, relatively fixed in their location, Meanwhile other, un-photoexcited, dye molecules remain relatively more mobile. This results in an initial migration and redistribution of dye to photoexposed regions until, dye migration being substantially complete, photopolymerization occurs, locking the migrated dye in place at a relatively higher concentration at the selectively exposed regions.

By this coaction of (i) polymerization and (ii) dye fixing there arises a concentration gradient of dye molecules in the material from the unexposed to the exposed areas. This concentration gradient results, of course, from diffusion of the dye from unexposed to exposed areas. This dye concentration is, of course, increased in exposed areas relative to unexposed areas.

After the selective radiation exposure stops an excess concentration of dye molecules in the exposed areas serves as a permanent record of the selective radiation exposure.

Regardless of exactly how the composition of matter, or medium, or process of the present invention is expressed, many specific aspects of construction and operation are preferred in implementation of the present invention.

Using the particular language of this section 5., the "medium" preferably further includes an inhibitor of the photopolymerization so that in regions of low radiation exposure polymerization is inhibited nonetheless that other regions where radiation is concentrated become fully polymerized. This inhibitor of the photopolymerization typically consists essentially of oxygen.

In the most preferred embodiment the binder consists essentially of (i) a matrix, for example cellulose acetate propionate, and (ii) a solvent, for example acetone.

Meanwhile, the photopolymer consists essentially of (i) a monomer, for example dipentaerythritol pentaacrylate; (ii) a crosslinker, for example 1-vinyl-2-pyrrolidinone; (iii) an initiator, for example N-phenyl glycine; and (iv) a photosensitizer, for example camphor quinone. A polymer chemist will recognize the function of these constituent components, and the utility of each within a polymerizable system.

Meanwhile, the dye is preferably fluorescent, and, although permissively drawn from a large group, preferably consisting essentially of (i) Rhodamine B; and/or (ii) Bodipy Red.

In use of the medium the photopolymer is initially substantially uniformly doped with the dye which, as stated, is preferably fluorescent. The medium is selectively illuminated in regions to write and to store data as an optical memory, reading of the optical memory transpiring by inducing fluorescence of the dye.

When the selectively illuminated regions are voxels, the optical memory becomes a three-dimensional volume optical memory.

Reading of the optical memory transpires by detecting relative presence or absence of the dye, preferably through its fluorescent light emissions when stimulated.

5. A Method of Radiatively Recording Information in a Photosensitive Medium

In still yet another of its aspects the present invention is embodied in a method of radiatively recording information in a photosensitive medium.

The method commences by establishing a host binder, or matrix, containing (i) a photopolymer that is polymerized by radiation initially doped with (ii) a dye that photoinitiates photopolymerization. Here again is that theory of the invention, one of many, where photoinitiation is promoted by the dye. There is as much support for this theory as any other: the most preferred dye is in fact a photoinitiator of photopolymerization. It is not, however, believed critical to the present invention that it should be a photoinitiator. It is thus, as previously stated, very much a matter of what is emphasized in expounding different, but equally plausible, theories of the present invention.

This matrix is then selectively exposed in selected regions by radiation so that the dye migrates to redistribute itself to exposed regions until, dye migration being substantially complete, photopolymerization occurs, therein serving to lock the migrated dye in place at a relatively higher concentration at the selectively exposed regions. The regions where is present the dye represent the information recorded.

The recording of information is most commonly for the purpose of making a radiation memory. Reading of the radiation memory transpires by radiatively detecting the relative presence, or absence, of the dye in the regions of the matrix. This radiative detecting of the relative presence, or absence, of the dye is preferably by inducing fluorescence in fluorescent dye.

6. A Radiation Memory System

In still yet another of its aspects the present invention is embodied in a radiation memory system that is at least writable, and that is preferably read-writable.

The system includes (i) a first laser; illuminating with a first laser beam (ii) a mask; which is imaged through (iii) a 4-f lens system; to a certain depth within (iv) a volume optical recording medium. This medium consists essentially of (i) a host matrix, containing (ii) a photopolymer that is polymerized by radiation, doped with (iii) a dye having a greater affinity for photopolymer than for the host matrix.

Upon selective exposure by the first laser through the mask of certain regions of the matrix, the dye will initially migrate to redistribute itself to radiatively exposed regions until, dye migration being substantially complete, photopolymerization will occur, locking the migrated dye in place at a relatively higher concentration at the selectively exposed regions.

This writable radiation memory system may optionally, between the first laser and the mask, further include a rotating diffuser serving to break up the spatial coherence of the first laser beam and randomizing the diffraction image of the first laser beam along its propagation path except when it is in focus.

It may still further optionally include a lens for bringing to a focus the first laser beam within a volume optical recording medium.

The memory system may be expanded and extended to reading. Such a read-write radiation memory system further preferably includes (i) a shutter means for blocking the first laser beam; (ii) a second laser for producing a second laser beam; (iii) a lens for focusing the second laser beam onto selectively exposed regions of the matrix that are at a particular depth within the volume optical recording medium, causing the exposed regions to fluoresce; and (iv) a detector of the fluorescence as representing the read contents of the volume optical recording medium, ergo a read-write optical memory. The (iii) lens particularly preferably consists of a cylindrical lens, and the (iv) detector is preferably a CCD.

These and other aspects and attributes of the present invention will become increasingly clear upon reference to the following drawings and accompanying specification.

BRIEF DESCRIPTION OF THE DRAWINGS

Referring particularly to the drawings for the purpose of illustration only and not to limit the scope of the invention in any way, these illustrations follow:

FIG. 11 is a diagrammatic representation of the manner of the recovery of the recording of the images of FIG. 10 by stepping the focal position of the objective lens starting with the deepest image first.

FIG. 12, consisting of FIGS. 12a through 12f, are diagrams showing reactions during photopolymerization (fm. ref. 12)

FIG. 13 is a diagrammatic representation of grey-level mask array for fabricating conical lenses with uniform light in photopolymer.

DESCRIPTION OF THE PREFERRED EMBODIMENT

Figure 1:
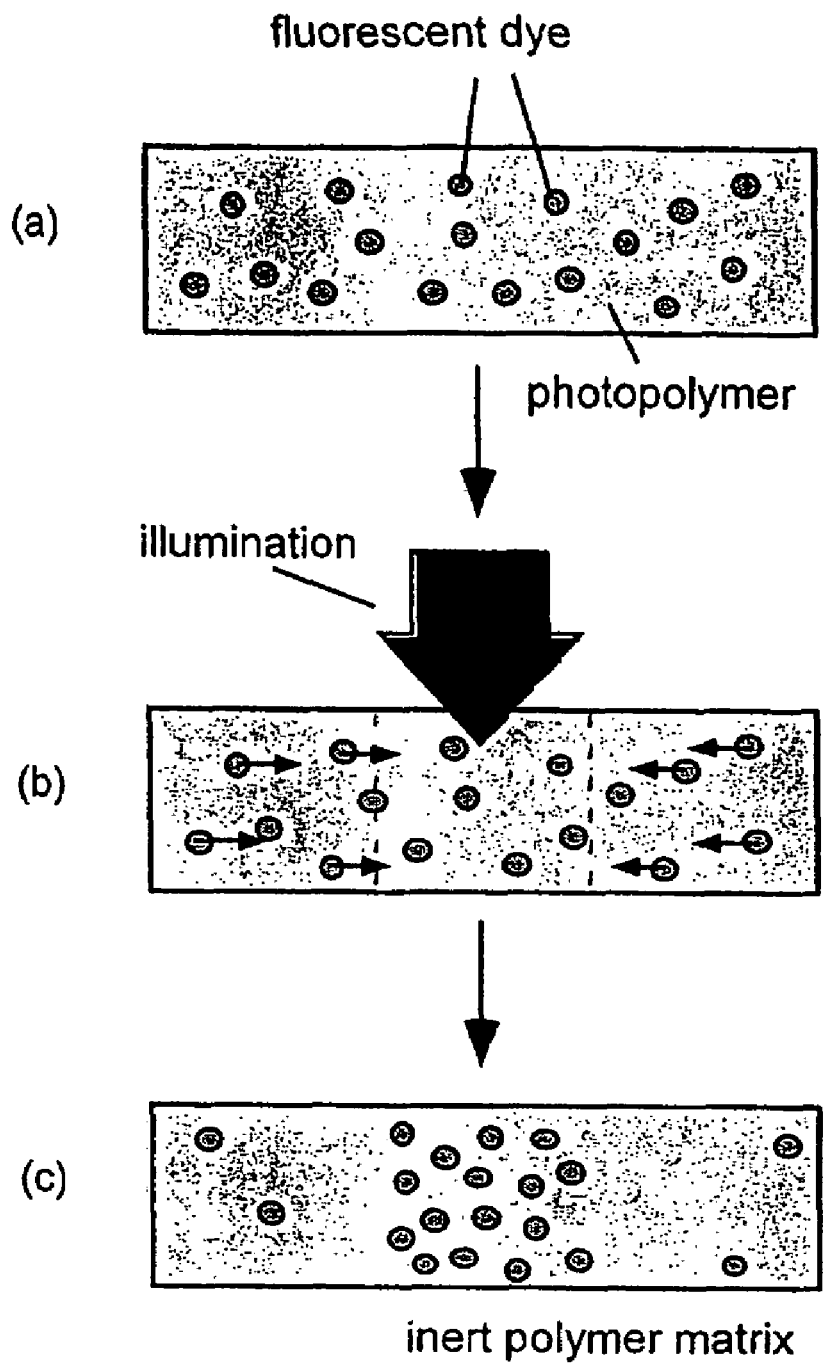
FIG. 1, consisting of FIGS. 1a through 1c, is a diagram showing the mechanism of recording where in (a) the media begins with a uniform distribution of fluorescent dye throughout the volume; in (b) light begins photopolymerization and simultaneously fixes dye to the polymer matrix while free dye will diffuse into the exposed areas leaving the unexposed regions depleted of dye; and in (c) after completion of the polymerization process the dye is held in a permanent polymer matrix.

Although specific embodiments of the invention will now be described with reference to the drawings, it should be understood that such embodiments are by way of example only and are merely illustrative of but a small number of the many possible specific embodiments to which the principles of the invention may be applied. Various changes and modifications obvious to one skilled in the art to which the invention pertains are deemed to be within the spirit, scope and contemplation of the invention as further defined in the appended claims.

1. A New Monolithic, Multi-layer Optical Media

The new monolithic, multi-layer optical media of the present invention has advantages over other new storage technologies in terms of ease of recording and readout, while sharing the same characteristics of very high density, fast access time, and parallel readout capability. The active portion of the media is a photopolymer—similar to that used for other volume optical media—which has in addition been doped with a fluorescent organic dye. Recording occurs during photopolymerization when the distributions of dye become more highly concentrated in the polymerized regions, therefore producing a modulated fluorescence readout pattern. In this architecture recordings are bit-oriented and are performed in a 2D parallel fashion. The readout which is based on excitation of fluorescence is non-destructive and is detected also in 2D parallel. Since index modulation, or changes in the material density, is not necessary for readout in this media some of the problems commonly associated with photopolymer memories such as shrinkage and optical scatter are less of a concern. This material is non-erasable, therefore given its ease of production and low-cost materials this media is best suited for mass distribution ROM applications.

In the following sections we will investigate the properties of this new media. In Section 2 we will describe the material composition and the optical setups used for image recording. The fluorescence modulation process which is based on the diffusion of dye within the material will be described and shown experimentally. In Section 3 we will then examine the non-linear recording characteristics that have been observed for this material. Specifically, a threshold in the recording intensity response will be demonstrated that indicates that this material is suitable for multi-layer data storage. The origin of this threshold will be investigated with a simple model and verified through a series of recordings. In Section 4 we will present the results of a four-layer recording and readout demonstration and discuss the limitations of this media. Finally, in section 5 we give the best and most complete theory of which we are presently possessed as to how, why and in what best mode photopolymerization for purposes of three-dimensional optical data storage in fluorescent dye-doped photopolymer in accordance with the present invention proceeds.

2. Materials and Recording

The preferred embodiment of optical recording media in accordance with the present invention consists of an inert polymer host in which is suspended both a fluorescent dye and a complete photopolymer system. The photopolymer used here polymerizes in a standard free-radical reaction and consists of the monomer dipentaerythritol pentaacrylate, the crosslinker 1-vinyl-2-pyrrolidinone, the initiator N-phenyl glycine, and the photosensitizer camphor quinone. The recording wavelength of this material is determined by the photosensitizer which in this case has an absorption peak very close to the blue 488 nm line of an argon ion laser. In these results we have chosen Rhodamine B as the fluorescent dye which absorbs well at the 543.5 nm wavelength of a green helium neon laser and has an orange fluorescence band from 560 nm to 640 nm. We have also tried a number of other dyes with similar success including Bodipy Red which has an absorption peak at 650 nm and fluorescence at 665 nm, thus allowing compact red diode lasers to be used for readout. All of these active components are suspended in a binder of cellulose acetate propionate and dissolved in acetone.

The pre-polymer mixture must be kept in a semi-viscous state in order for the active components to have a sufficiently high diffusion rate, therefore samples are prepared in sealed square cuvets. After polymerization the material becomes solid and inert. Difficulties may arise from having a pre-polymerized material that is not solid since layers within the volume are potentially free to drift within the viscous medium unless the recorded layers are anchored to the bottom or all of the layers are recorded very rapidly in a simultaneous manner. For these experiments we have used the former approach to avoid movement of the data, however for this material to be useful as a mass distribution ROM media an appropriate optical data stamping technique should be developed so that information can be duplicated in the media in a rapid, inexpensive fashion. Implementing massively parallel recording may be one approach to rapid optical data stamping.

The mechanism of recording in this material is shown in FIG. 1. Before recording the fluorescent dye molecules are evenly distributed throughout the media, however during the recording process a modulation of the fluorescence intensity according to the recorded pattern is developed. We believe that this modulation results from a binding of dye molecules to the polymer matrix since it has been observed that Rhodamine B can act itself as a photoinitiator for this monomer without any other additional dopants. Two processes are therefore initiated by exposure to blue light: polymerization and dye fixing. In the exposed areas, the monomer undergoes a polymerization process that solidifies the matrix, while, simultaneously, photoexcited dye molecules bind to both monomer and polymer molecules. Dye molecules that are incorporated in the polymer matrix will become fixed in their location resulting in a concentration gradient of free dye molecules in the material. This concentration gradient causes more dye to diffuse in from the dark regions thereby increasing the total fluorescence level observed in the exposed areas and reducing that in the unexposed areas. Once the material has been fully polymerized and all of the free dye molecules have been bonded the fluorescence modulation is fixed and recorded images are permanent. Materials that operate on a principle similar to that described here have also recently been developed for holographic memories where the goal there is to maximize index modulation rather than fluorescence modulation.

Figure 2:
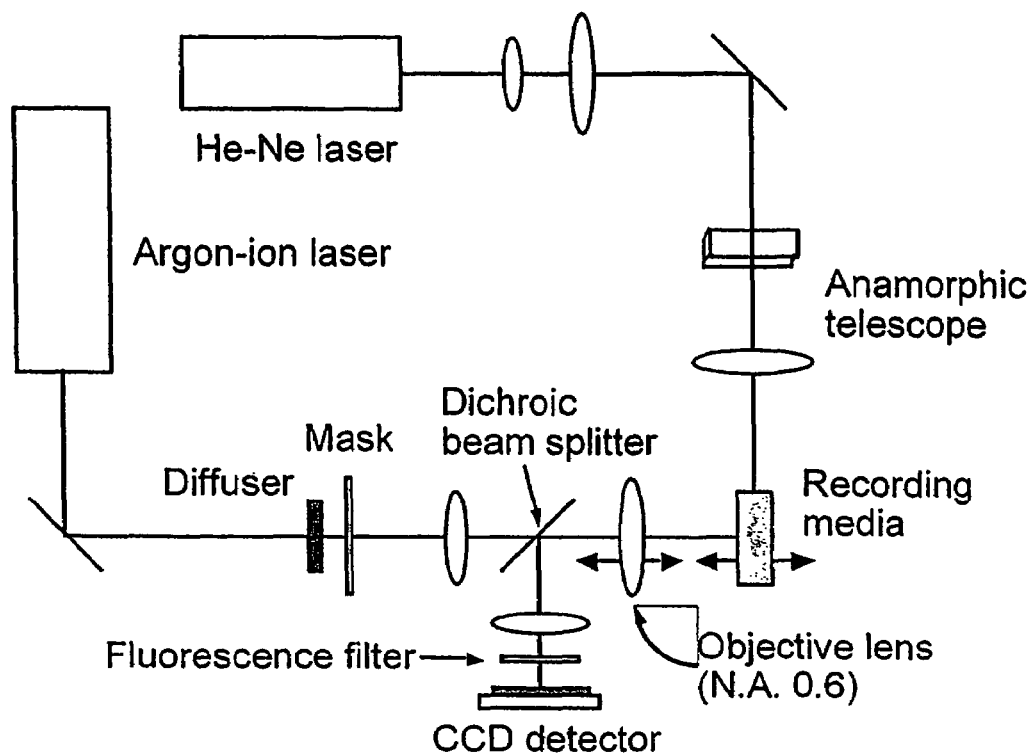
FIG. 2 is a schematic diagram of the optical system used for both recording and readout of the dye-doped photopolymer media.

FIG. 2 shows the optical setup used for both recording and readout of data. An argon laser illuminates a mask which is imaged through a 4-f system to a certain depth within the recording media. The rotating diffuser immediately before the mask is necessary to reduce inter-layer crosstalk by breaking up the spatial coherence of the source and randomizing the diffraction image of the beam along its propagation path except when it is in focus. An Olympus 40x/0.6 N.A. microscope objective that can variably compensate the spherical aberrations of up to 2.5 mm of plastic or glass is used to focus into the media. The position of the microscope objective is stepped axially to image to different depths within the media for multi-layer recordings. Images are recorded in exposures typically ranging from 2 sec to 20 sec with the argon laser focused down to recording intensities between 1 and 10 W/cm$^2$.

Readout is performed by blocking the recording beam and illuminating the recorded layer orthogonally with 350 μW from the green He—Ne. The green beam is cylindrically focused into a thin sheet of light approximately 15 μm thick to select just one layer out of the volume. The fluorescent dye absorbs the green light and then emits an orange fluorescence that is collected and imaged onto the CCD detector. The orthogonal nature of the readout scheme permits 2D parallel detection of data which in a high speed readout system may allow extremely high data transfer rates.

Figure 3:
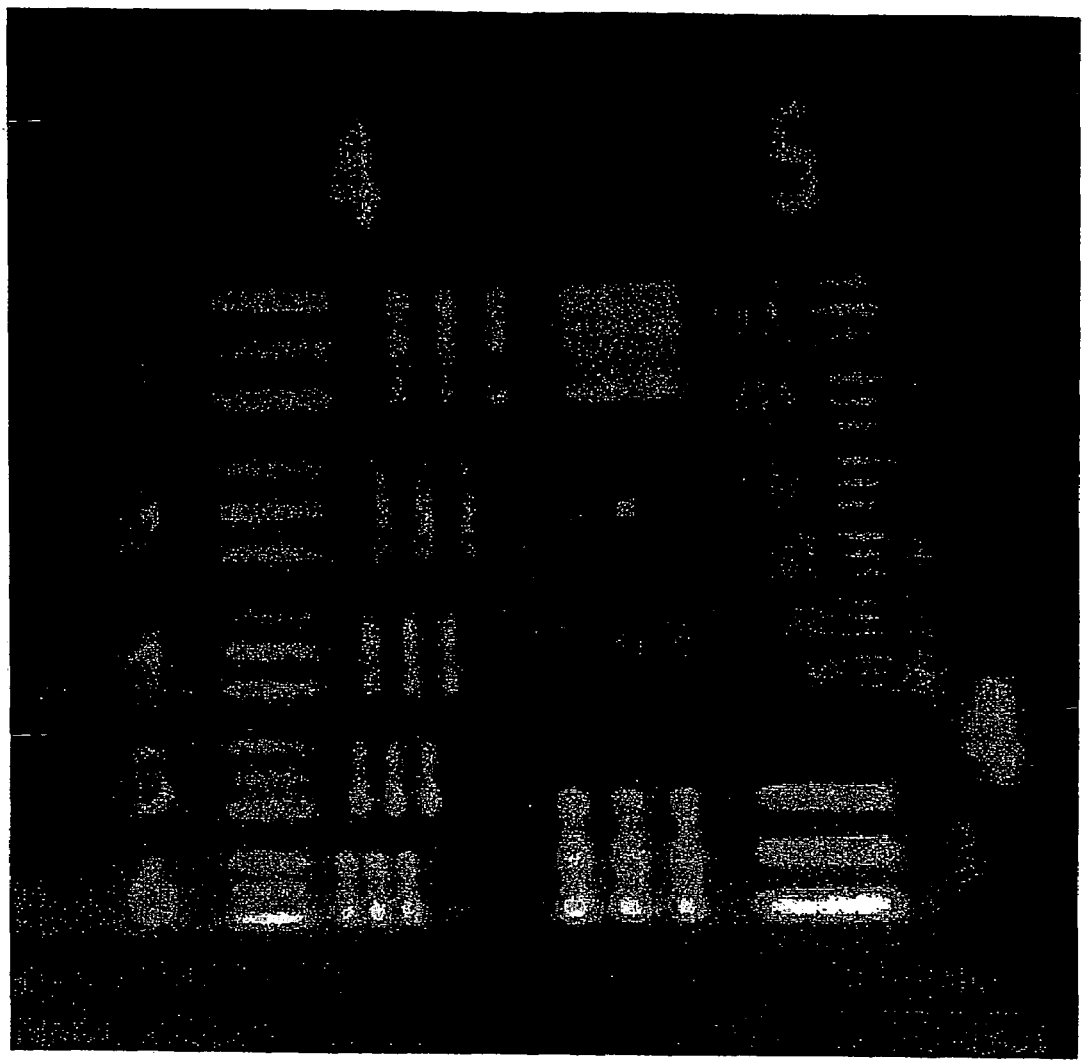
FIG. 3 is a pictorial representation of a resolution target image recorded into the dye-doped photopolymer media and readout by the excitation of fluorescence in the recorded layer.

A typical single plane recording of an air force resolution target is shown in FIG. 3. The average contrast ratio of this image is less than 2:1. The smallest resolvable line pair group is group 5:6 which after de-magnification corresponds to 1.28 μm/line pair, or a 0.64 μm minimum feature size. The material therefore exhibits sub-micron resolution which is a necessary requirement for a high density optical storage media. In this picture the green illumination beam is entering from the right side. On the left side of the image it is possible to see some non-uniformities in the readout beam which look like shadows. These shadows are a result of the small index changes that occur when the material polymerizes causing scatter and focusing in the beam. No attempt has been made in this work to minimize the index of refraction modulations, however further optimization of the material composition would be desirable in order to reduce these effects and improve the optical quality of the media. Recorded samples that have been stored in the dark for several months have also shown a slight degradation in image quality most likely from evaporation of the solvent due to leaks in the seal of the cuvet. A more stable solvent would be preferred to improve the shelf life of the material.

Figure 4A:
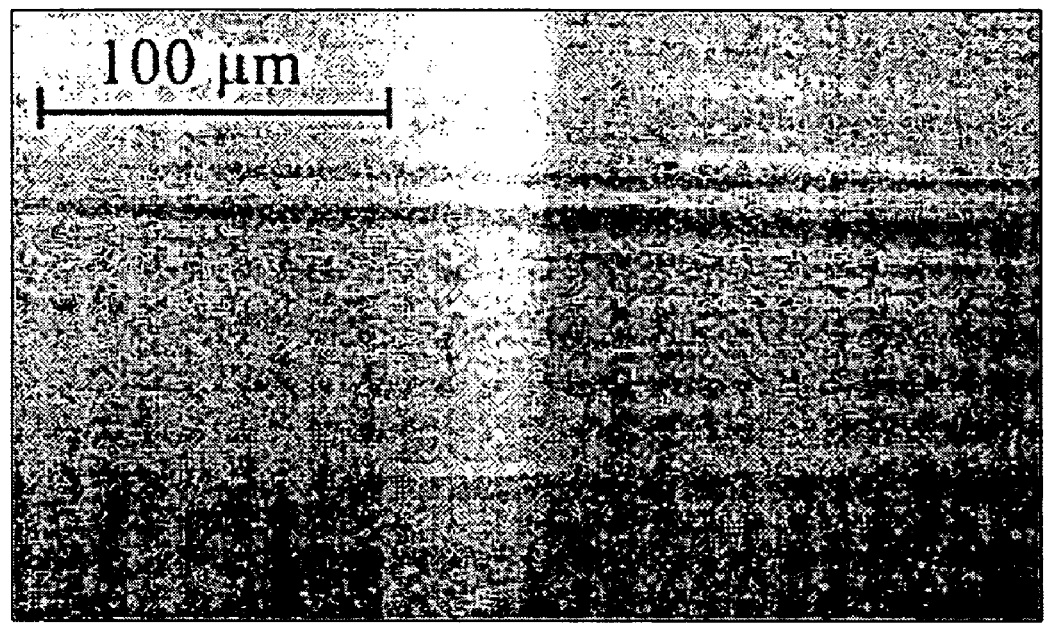
FIG. 4A showing edge enhancement observed 30 seconds after exposure as dye begins to diffuse into the exposed region.
Figure 4A:
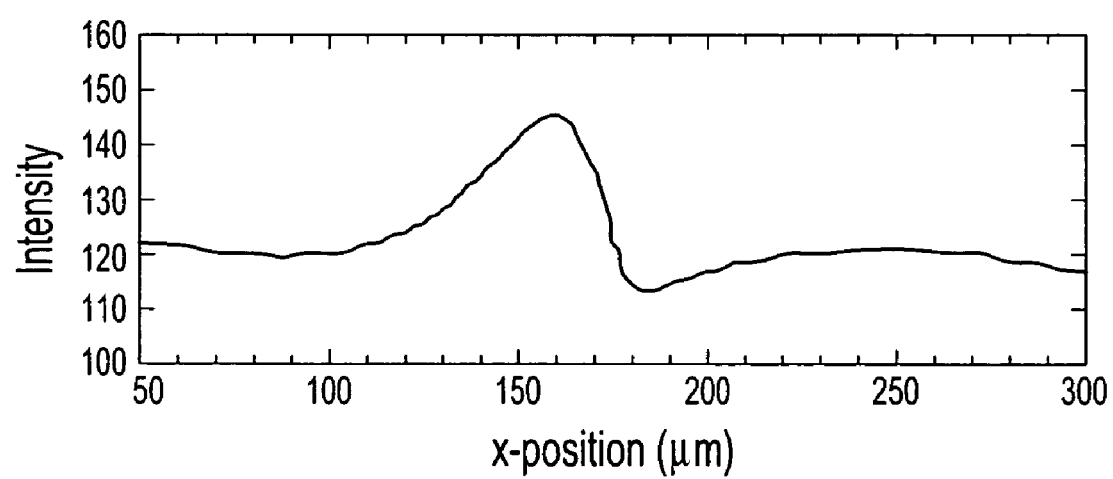
Figure 4B:
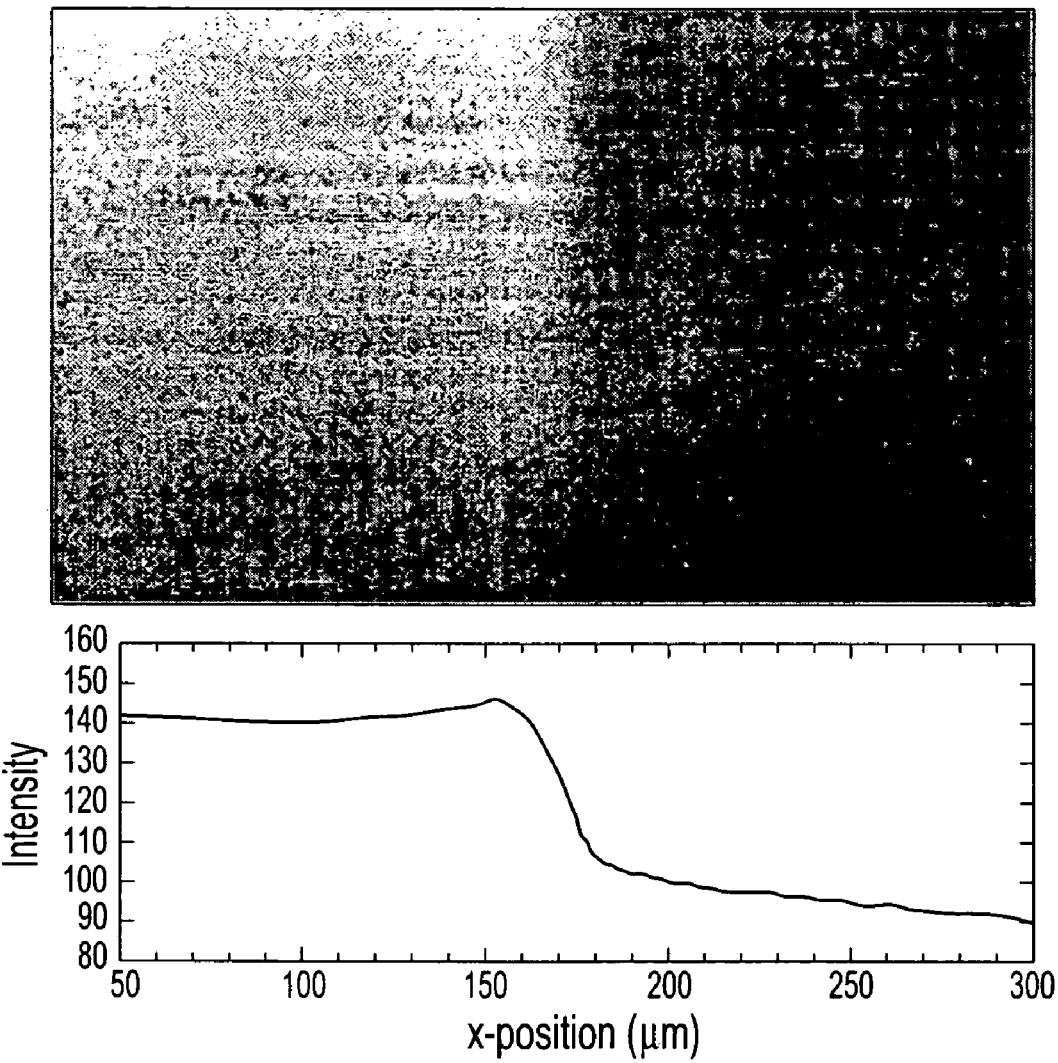
FIG. 4B five minutes after exposure the profile resembles a flat top while the dip in intensity corresponding to the dye-depleted region is gone; and with FIGS. 4C and 4D showing exposures that have been immediately followed by a uniform fixing exposure so that thirty seconds after the exposure of FIG. 4C the edge enhanced structure is again apparent, however 5 minutes after exposure of FIG. 4D the structure has not changed.
Figure 4C:
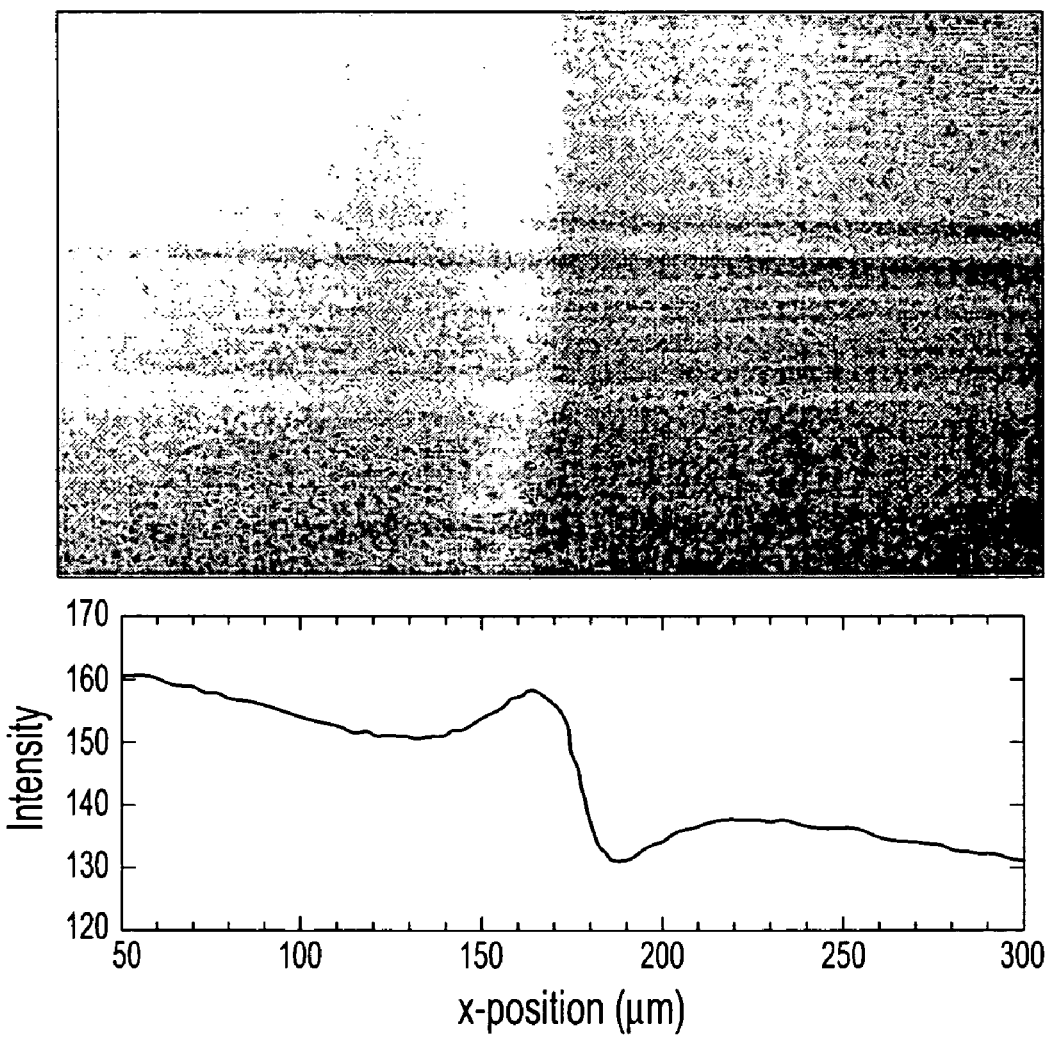
FIG. 4, consisting of FIGS. 4A through 4D, are pictorial images of the edges of exposed regions and accompanying horizontal profiles where in all cases the left half of the image has first been exposed.
Figure 4D:
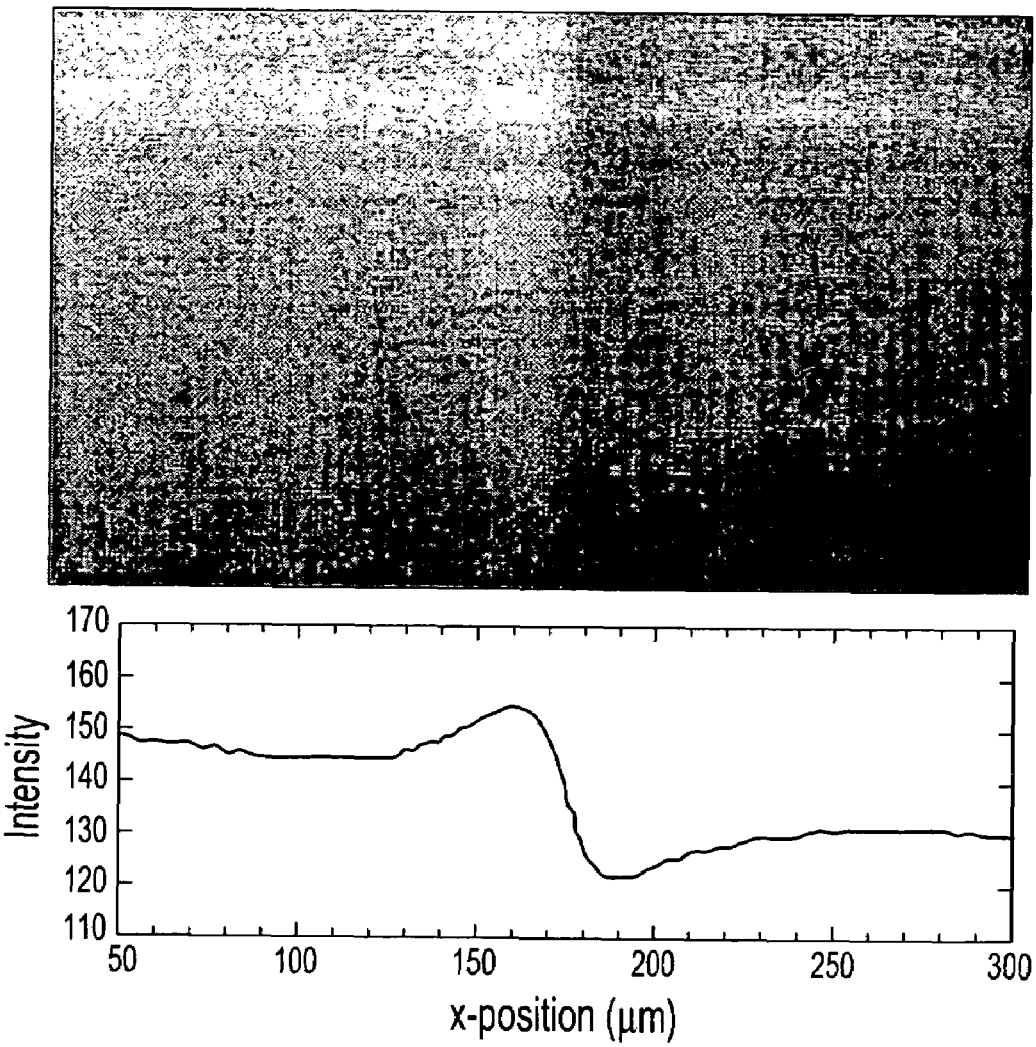

The diffusion process of the dye during recording can be observed by exposing a large region in the material. FIGS. 4A-4D show four images in which the left half of the sample has been exposed to light. Immediately after exposure an edge enhancement of the boundary between the exposed and unexposed regions may be observed as dye diffuses into the exposed region (see FIG. 4A). Dye concentration builds up most quickly closest to the edges leaving a dye-depleted region immediately outside the exposed area. Over a period of minutes the entire exposed region will slowly rise to a uniform fluorescence level (see FIG. 4B). The edge enhanced recording observed in 4A can be fixed, however, by immediately applying a second exposure that uniformly illuminates the entire image and bonds all of the dye in the sample. FIGS. 4C and 4D show a fixed image immediately after the second exposure and also 5 minutes later. It can be seen that the characteristic edge enhanced structure is still evident even several minutes after the exposure.

Because the fluorescent signal strength of a recorded data image is dependent on diffusion of dye from neighboring unexposed regions, it can be seen that the recorded fluorescence intensity may vary depending on the size of the recorded bit and the number of neighboring bits which have been recorded. For recording of digital data modulation codes such as a bi-phase (or Manchester) code may be necessary to ensure uniform signal strength of recorded bits.

3. Non-linear Polymerization 3.1 Modeling

In order for any particular media to be viable as a three-dimensional optical media it must be possible to selectively record layers within the volume without adversely affecting the information stored at other layers. This material exhibits an intensity threshold in its recording curve which results from the presence of the inhibitor oxygen. Oxygen is dissolved in the mixture because the samples have been prepared in air. In most cases, the presence of oxygen in photopolymers exhibits itself as an exposure time threshold, however in this material an intensity threshold may also be observed due to the material's high diffusion rate. The existence of this intensity threshold is independent of the presence of the fluorescent dye and can be demonstrated through a simple model of the polymerization process of a photopolymer.

The processes that will be considered in this model are: free radical generation by light, chain initiation (the creation of a radical site on a monomer or polymer), chain propagation (the addition of monomers to a polymer chain), chain termination (the neutralization of a polymer radical site), radical annihilation (the neutralization of free radicals with each other), inhibition (the neutralization of radicals by oxygen), and diffusion. We wish to write down the rate equations for the following components of the photopolymer: the monomer (M), the polymer (P), the inhibitor (H), the free-radical initiators (R.), the radical sites on the polymer chain (P.), and the neutral components such as the solvent or binder (N). For some arbitrary input light intensity I(x,y,z,t) the rate equations are given as:

$$\frac{\partial [R\cdot]}{\partial t} = \left(\frac{\sigma \eta}{\hbar \omega}\right) I(x, y, z, t)[R] + \alpha_R \nabla^2 [R\cdot] - \qquad (1)$$
$$k_i[R\cdot]([M] + [P]) - k_a[R\cdot]^2 - k_t[R\cdot][P\cdot] - k_h[R\cdot][H]$$

$$\frac{\partial [H]}{\partial t} = \alpha_H \nabla^2 [H] - k_h[H]([R\cdot] + [P\cdot]) \qquad (2)$$

$$\frac{\partial [M]}{\partial t} = \alpha_M \nabla \cdot ([N]\nabla [M] - [M]\nabla [N]) - k_p[M]([R\cdot] + [P\cdot]) \qquad (3)$$

$$\frac{\partial [P\cdot]}{\partial t} = k_i[R\cdot]([M] + [P]) - k_t[R\cdot][P\cdot] - k_h[P\cdot][H] \qquad (4)$$

$$\frac{\partial [P]}{\partial t} = k_p[M]([R\cdot] + [P\cdot]) \qquad (5)$$

where the k's correspond to the rate coefficients for the polymerization processes of chain initiation ($k_i$), chain propagation ($k_p$), chain termination ($k_t$), radical annihilation ($k_a$), and inhibition ($k_h$), the α's correspond to the diffusion constants for free-radicals ($\alpha_R$), inhibitors ($\alpha_H$), and monomers and neutral components ($\alpha_M$), σ is the absorption cross-section at the given wavelength, and η is the conversion efficiency of the initiator into free-radicals. We assume that the number of free-radicals generated is small compared to the total concentration of initiators (R). The various constants in these equations have either been measured from the material or taken as typical values from the literature.

Polymer and radical sites on the polymer are assumed not to diffuse. The remaining components must inter-diffuse as a multi-component system. In order to simplify this problem we may observe that the concentration of free-radicals and inhibitors is much smaller than that of monomers, polymers, and neutral components and therefore may be approximated to diffuse freely. We are left then with diffusion in a bi-component system (between monomers and neutral components) which—if we assume the densities of these components are similar—may be approximated as shown in Eqn. 3 subject to the conservation of mass equation:

$$[M]+[P]+[N]=\text{constant} \qquad (6)$$

As polymerization occurs the concentration of monomer will drop, leading to diffusion of monomers into the exposed areas and expulsion of the neutral component. Polymerization will cease when the neutral component has been completely expelled from the irradiated region and all of the monomer has been converted to polymer.

As a measure of the degree of both the polymerization and diffusion in the material we will define a modulation ratio which is directly proportional to the polymer plus the monomer content:

$$\text{modulation ratio} = \frac{[M](0, t) + [P](0, t)}{[M](2a, t) + [P](2a, t)} \qquad (7)$$

where the modulation is compared between the center of the exposed region and a point one diameter away. A high modulation ratio will indicate a high degree of polymerization and diffusion of the monomer.

We wish to simulate the recording of a single bit in the media. To reduce the complexity of the computation a spherically symmetric intensity distribution was chosen, $$I(r) = \begin{cases} I_0, & \text{for } r \leq a \\ 0, & \text{for } r > a \end{cases} \qquad (8)$$

allowing the solution to be solved just in terms of r and t.

Figure 5:
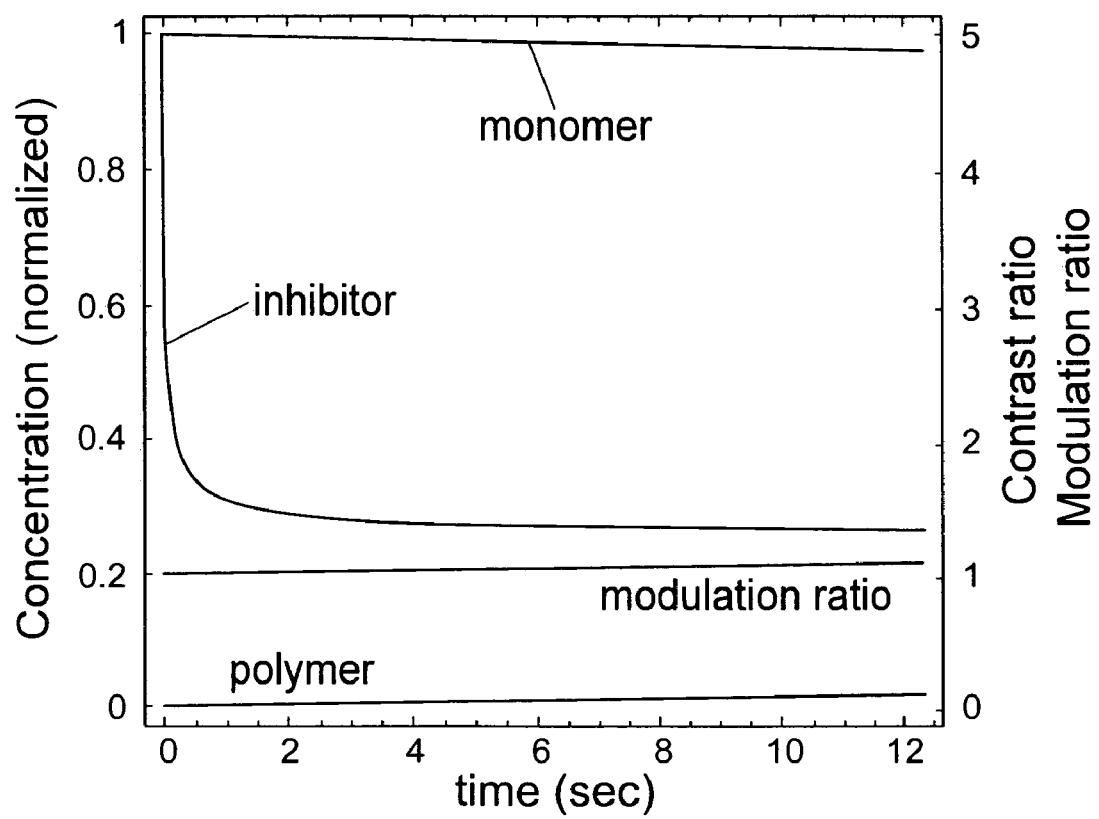
FIG. 5 is a graph showing a numerical simulation of component concentrations and modulation ratio for low intensity exposure, $I_0$=0.41 W/cm$^2$, where polymerization is inhibited.
Figure 6:
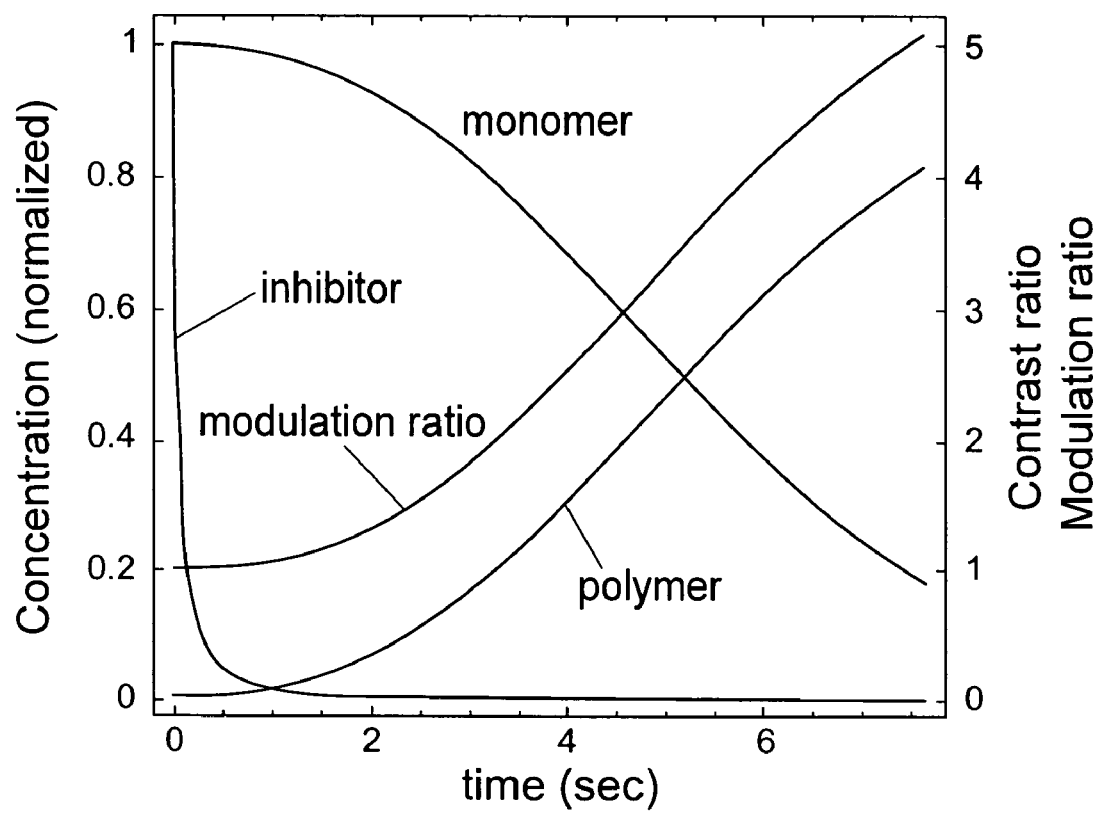
FIG. 6 is a graph showing numerical simulation of component concentrations and modulation ratio for high intensity exposure, $I_0$=0.65 W/cm$^2$, where, after a short induction period, polymerization begins.

The rate equations are solved numerically for a given set of parameters. FIGS. 5 and 6 show the component concentrations at r=0 during an exposure for two different intensity levels. We can see that for a low recording intensity, $I_0$=0.41 W/cm$^2$ (see FIG. 5), the rate of radical generation and inhibitor consumption is slower than the diffusional rate of the inhibitor and therefore the inhibitor concentration never reaches a zero level but instead plateaus into a quasi-equilibrium state. Polymerization in the exposed region is therefore negligible even for long exposure times. However for a higher recording intensity, $I_0$=0.65 W/cm$^2$ (see FIG. 6), the inhibitor consumption rate is higher than the diffusional rate and the inhibitor concentration falls to a low enough level for polymerization to occur. It can be seen that after a short induction time monomers begin to be converted into polymer while more monomer flows into the exposed region, resulting in an increasing modulation ratio.

Figure 7:
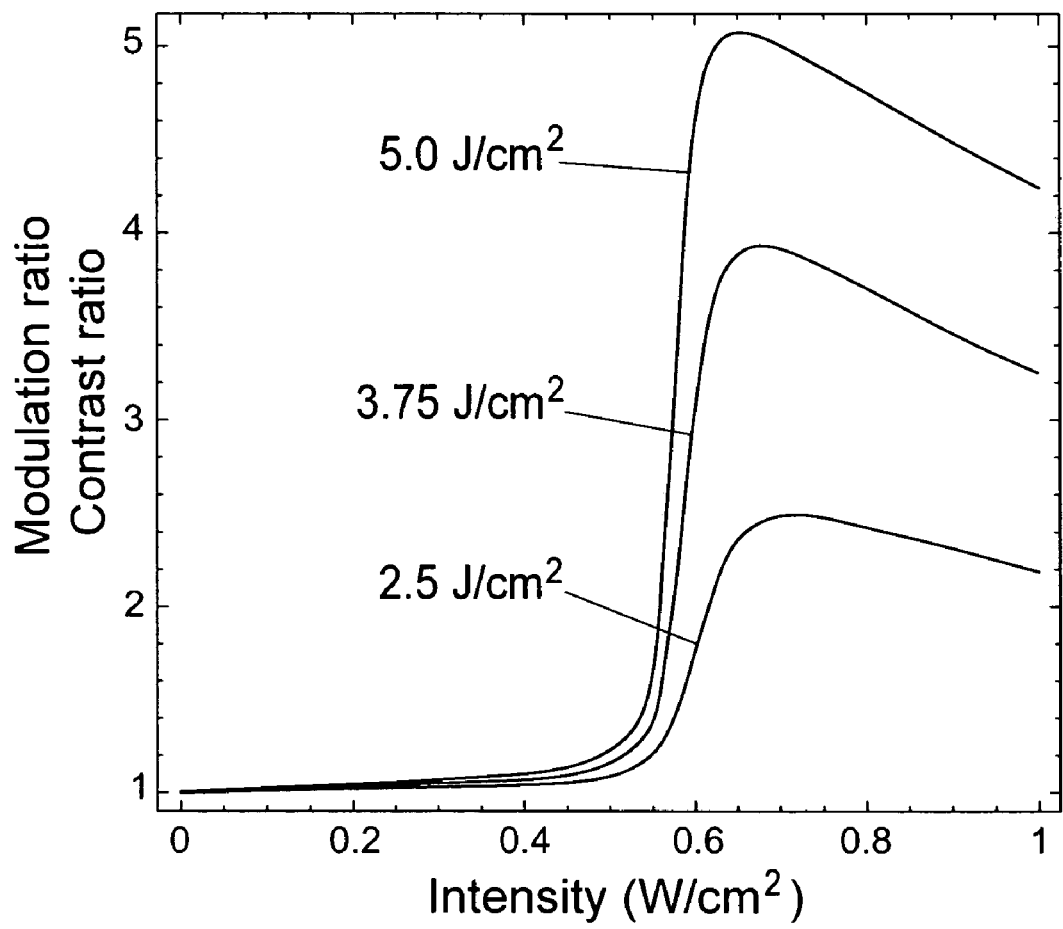
FIG. 7 is a graph showing numerical simulation of modulation ratio as a function of recording intensity for images recorded at three different exposure energies. In all cases a sharp threshold is observed followed by a rapid increased in the degree of polymerization. Below the threshold point polymerization is negligible.

Somewhere between the two intensities shown in these two figures there will exist a certain cross-over threshold when the inhibitor consumption rate surpasses the compensating diffusion rate. In FIG. 7 modulation ratio is plotted as a function of recording intensity for three different exposure energies. The exposure time is compensated in each according to the recording intensity to maintain a constant exposure energy. As expected, in each curve there is a distinct intensity threshold followed by a rapid increase in the degree of polymerization. For much higher intensities (and shorter exposure times) the modulation ratio begins to fall off again since there is less time for monomer components to diffuse. Radical annihilation—which is proportional to the square of the radical concentration if we assume that annihilation occurs as the re-combination of two free-radicals—will also become more of a factor at higher intensities and also reduce the polymerization rate.

In designing a material for a three-dimensional media, the sharp threshold observed here is the desired characteristic. For a beam sharply focused into the material, recording will occur only at the most highly focused spot where the intensity reaches above the recording threshold. Elsewhere, the media will not be affected. Sharpening the threshold—making the ratio between the threshold and saturation intensities closer to 1—will have the desirable effect of increasing the number of layers that may be recorded in a single media. The position of the threshold level may be modified by adjusting the balance between inhibitor consumption and diffusion either by increasing the initial concentration of inhibitors through the addition of another inhibitor besides oxygen, or by increasing the diffusion rate in the material through changes in the chemical composition or by heating of the material. The position of the saturation level is determined by the polymerization rate which can also be modified by a number of different parameters. Using the model we are able to choose intelligent directions for optimization of the media that maximize the threshold/saturation ratio.

It should be noted that this model excludes many higher-order polymerization effects. For example, in the model we have not taken into account the expected reduction in diffusion rate that will occur as the exposed regions reach higher levels of polymerization. Known as the gel effect, this reduction in diffusion would be expected to both increase the rate of polymerization (as the rate of chain termination is slowed) while decreasing the flow of monomer into the exposed regions. Differences in our model and our experimental results may be accounted for by the gel effect as well as other thermal and optical photopolymerization effects that have not been included.

3.2 Experimental

In the model described above we have only examined the polymerization process of a standard photopolymer and we have not included the fixing and diffusion of the fluorescent dye included in the fluorescent photopolymer media. We will now experimentally investigate the fluorescence contrast ratio that results during recording in this media which includes the non-linear processes of both the polymerization and dye diffusion. Although polymerization modulation ratio and fluorescence contrast ratio are not equivalent measurements, we can use the more easily observable fluorescence contrast ratio as some indication of the degree of polymerization since fluorescence modulation will not occur unless the dye position has become fixed.

Figure 8:
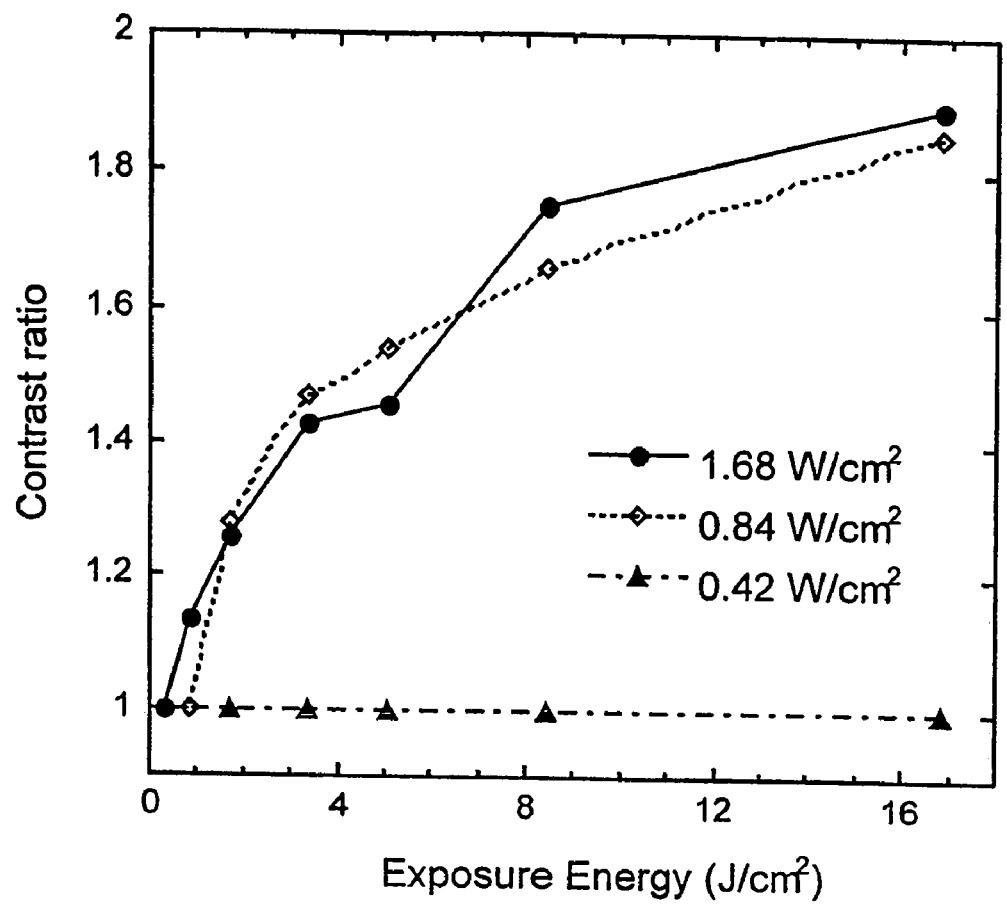
FIG. 8 is a graph showing fluorescence contrast ratio of images recorded for varying exposure energies at three different constant intensity levels.
Figure 9:
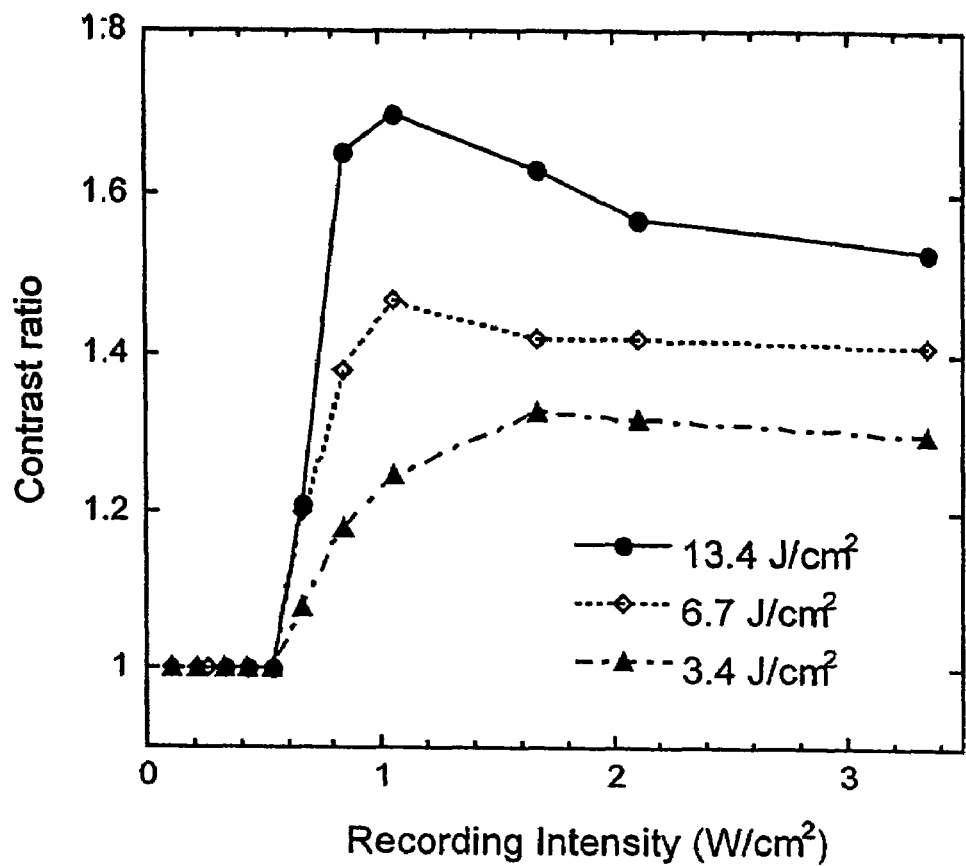
FIG. 9 is a graph showing fluorescence contrast ratio of images recorded at varying intensity levels for three different constant exposure energies.

We have experimentally investigated the recording characteristics of this material through a series of recordings under different exposure conditions while measuring the observed fluorescence contrast ratio for 4 µm wide bars. FIG. 8 shows the resulting contrast ratio of recordings for varying exposure energies at three different recording intensities. The two higher intensities show a short induction period followed by polymerization, however for the lowest recording intensity (0.42 W/cm$^2$) no image was formed regardless of the exposure energy. The apparent recording intensity threshold may be observed more clearly in FIG. 9 where contrast ratio is plotted over a range of different intensities. In all recordings the exposure time was adjusted to produce a constant total exposure energy. It can be seen that below a recording intensity of approximately 0.6 W/cm$^2$ no image is formed. The contrast ratio increases rapidly for intensities higher than the threshold and then plateaus at different levels depending on the total exposure energy. Experimentally we observe the same intensity threshold effect predicted by the polymerization model. This threshold now allows us to perform multi-layer recording.

4. Multi-Layer Recording

Figure 10:
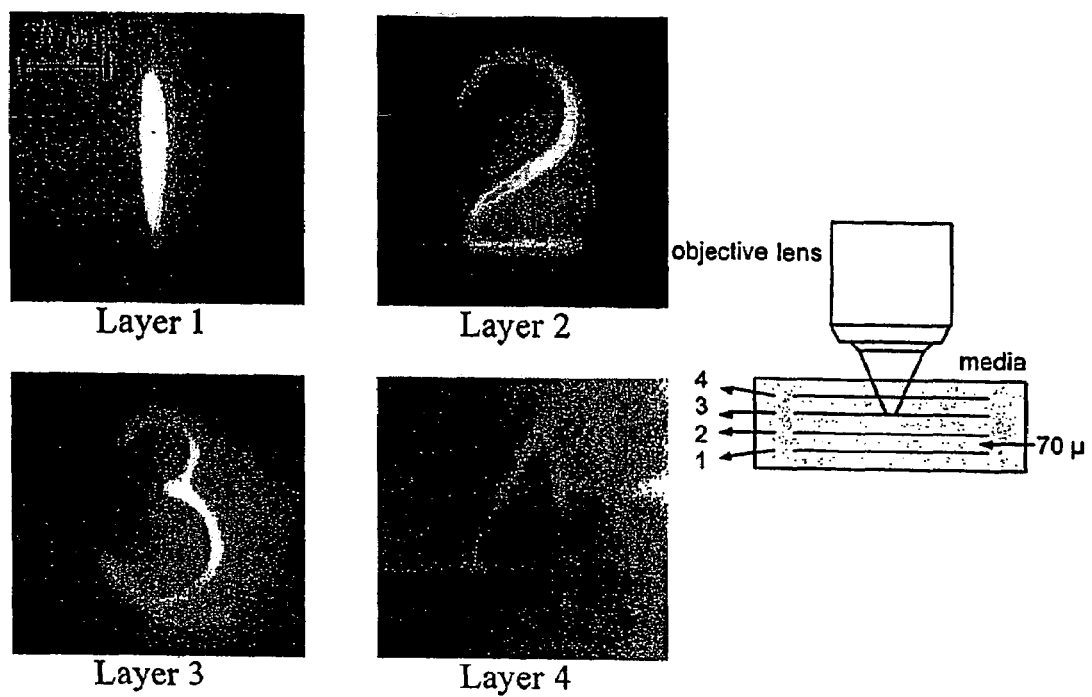
FIG. 10, consisting of FIGS. 10a through 10d, are pictorial images readout from four layers recorded in the media 70 μm apart in depth.

To demonstrate the multi-layer capability of this media four images at varying depths were recorded (see FIG. 10). Images were recorded in order from deepest to shallowest with a spacing between layers of 70 µm. It can be seen that the deeper images are somewhat brighter than the images closer to the surface. We have determined from experiment that this is not a result of the recording order but more likely a difference in the material component concentrations in the thin layer closest (<100 µm) to the surface of the media. Evaporation of the solvent during sample preparation may result in reduced dye mobility and therefore a reduced image contrast. A small degree of inter-layer crosstalk is also visible between the images. Because the illumination beam for the mask was not completely uniform the recording intensity had to be increased in order to record the outer edges of each image. The higher intensity in the center of each image exceeds the intensity threshold condition at neighboring planes resulting in crosstalk. This difficulty highlights the importance of having a very uniform illumination beam maintained at just above the threshold recording intensity.

The minimum acceptable spacing between layers is determined by the effective numerical aperture of the recording optics as well as the degree of non-linearity in the recording process. The depth over which an image is recorded will be determined by the rate at which the focused image expands and falls below the recording intensity threshold. The focal depth of a lens is inversely proportional to the square of the N.A. In these recordings the N.A. of the recording optics is only moderately high, moreover the features sizes in the images are very large. When the feature sizes are reduced, diffraction out of the focal plane will more quickly blur the image data and produce a uniform, low intensity background that will not be recorded on preceding or subsequent layers. It should also be noted that when using high N.A. optics it becomes necessary to compensate for the spherical aberrations induced by imaging through a thick medium. This can be done either through the use of aberration corrected optics—as was used here—or fluid immersion lenses which have the added advantage of allowing even higher numerical apertures although typically shorter working distances.

In addition to the layer spacing, the total usable thickness of the material will determine the maximum number of layers recordable in a single media. As we have mentioned, the maximum thickness of the media can be limited by optical clarity concerns. Optimizations of the material composition that minimize index of refraction modulations and density changes of the material during recording will allow the use of thicker and therefore higher capacity media.

4. Photopolymerization Theory

4.1 The Photopolymerization Process

The process of photopolymerization has been extensively studied, so the reader is referred to other sources for a more exhaustive review. There are in general two types of photopolymerization, free radical and ionic, the difference between the two being that in the latter the photon excites an electron on the monomer directly to a π-electronic state, rather than by a photoinitiator intermediary. This usually requires UV wavelengths, whereupon the molecule de-excites into a radical state, becoming a radical monomer. However, most polymers are highly absorptive in the UV, thus for using materials with a mixture of properties or for creating structures that depend upon the intensity profile, this sort of addition polymerization is not appropriate. Thus embodiments rely upon free radical polymerization to create structures in photopolymer.

The basic chemical constituents for radical polymerization reaction are a photoinitiator, a monomer basic unit, and a photosensitizer. The latter determines the wavelength range of photopolymer, since the photosensitizer molecule commences the reaction by absorbing a photon and thus exciting one of its electrons to a higher energy state. If this molecule collides with an initiator molecule within its excitation lifetime, then the initiator molecule transfers an electron to the sensitizer, causing the initiator to become a free radical. When this free radical encounters a monomer, the affinity for the radical is such that a double carbon bond on the monomer is changed into a single bond, allowing the radical to attach itself to the monomer and also leaving a radical site on the monomer unit. Thus there is now left what is called a 'radical monomer', which can act as a free radical photoinitiator does, attaching additional monomer units to itself in a serial fashion, while still maintaining a radical site on the chain. This process is called chain propagation, and continues until the chain is terminated by collision with another free radical of the opposite sign. Since this is an random process, different chain lengths are generated, the distribution of the lengths dependant upon temperature, initiator and photosensitizer concentration, etc. and is Maxwellian in nature.

One can also add an additional agent called a cross-linker to the above chemical constituents. The cross-link agent creates additional radical sites on the monomer, causing the chain to grow 'branches' which increase the molecular weight of the resulting polymer, causing the polymerized region to become denser. Since density changes are correlated with refractive-index changes through the Lorentz-Lorentz equation, the addition of a cross-linker agent is often desirable.

Inhibitors such as oxygen are present in any photopolymer mixture that is not prepared in a neutral environment, such as nitrogen atmosphere or vacuum. These inhibitors usually have a higher affinity for the radical initiators than the monomers do, combining with the radical initiators to create a neutral molecule. Thus the photopolymerization process described above does not start until all the inhibitors in a local region that is being irradiated have been consumed. This is manifested on a macroscopic scale as a 'threshold' in recording time before reaching the linear recording regime. Although pre-exposure of the photopolymer mixture removes the majority of these inhibitors, continual diffusion from the air into the mixture will always require some intensity threshold to be crossed before polymerization can occur.

Consider the localization of the polymerization process. Within a constant irradiance region, there will be concentration fluctuations of initiator, inhibitors, photosensitizers and monomers. These will create localized regions where the recording threshold is crossed first and polymerized 'seeds' are formed. Thus in this way concentration gradients (chemical potential gradients, in the language of statistical mechanics) are formed, drawing in more monomer so that polymerization grows outwards from these seeds, while less-active components are forced out. Now consider the polymerization process between adjoining regions, one with a high irradiance and one with a low irradiance. In the former, radical initiators and monomers are being formed at a high rate as compared to the latter. Monomer units are drawn in from the low-illuminated area to the high illuminated area, the monomer traveling on the order of a diffusion length.

Of the higher-order effects in the previously described process that couple through the polymerization rate equations to create nonlinear effects between differently illuminated regions, two will be mentioned here. The first comes about because the densification of the polymer as time goes forward causes a larger decrease in the diffusion rate of the photopolymer in regions of high irradiance as compared to those exposed to less intensity. Called the gel effect, this manifests itself as an increase in the polymerization rate since the rate of chain termination is slowed (large molecules become 'trapped' and additional radicals find it harder to diffuse past denser chain networks) and the flow of monomer into these regions decreases as well. Combined, one should see a more rapid onset of polymerization than expected while having a lower-than expected index modulation.

Additionally, radical-radical collisions leading to radical annihilation are more likely to occur in the high-irradiated regions as compared to the low-illuminated regions. This reaction pathway by removing two radicals decreases the number of radicals that could cause early polymer chain termination, leading to longer, more crosslinked polymer chains. In this way a greater index modulation is set up between the regions of high irradiance as compared to the low irradiance regions despite eventual total polymerization. This is seen in FIG. 4, showing a one-component formatted polymer block in which a striped irradiance pattern created the high-contrast formatted regions while the low-contrast regions where polymerized later with an uniform irradiance. To further increase this modulation, it is possible to use multiple types of monomers, each with a different density and reactivity ratio, called a c/e ratio. This ratio is a measure of the chemical affinity of one monomer with respect to another monomer for attaching onto a polymer chain. Thus to maximize the index break it is best to select a high molecular-weight (high refractive index) monomer with a high c/e ratio and a low molecular weight monomer with a low c/e ratio.

There are two problems associated with polymerization as a method to manufacture precision structures. The first is that the densification of the media causes a volume change which causes shrinkage (change in the physical dimensions of the structure) Thus precise placement of small structures is difficult in polymers which have large shrinkage. However, other inventors and authors have proposed solutions leading to a low-shrinkage polymer. The second problem with using photons as a means for polymerization is light scattering. The seed regions where polymerization commences more often than not grow non-uniformly, creating scattering centers upon termination of polymerization in the structure. Methods to avoid this problem are currently under investigation.

5. Conclusion

The present specification has taught a new optical recording media that records information through the re-distribution of a fluorescent dye within a polymer host. This material exhibits an intensity threshold response due to the diffusional nature of the recording process allowing the three-dimensional confinement of recorded bits. Our conceptual description of the recording process has been verified by a simple model of photopolymerization and diffusion, and recordings in this material have been shown to exhibit both high resolution and the capability for multiple layers. Four layers have been recorded on 70 μm layer spacings with only a minimal amount of inter-layer crosstalk being visible. The recording and readout architectures of this memory both permit parallel optical transfer of data which eventually may provide extremely high data transfer rates, while the multi-layer capability of this media indicates that high capacities may be achieved while still allowing fast access times. Improvements must still be made in the material composition particularly in terms of material stability, nonlinearity, and optical quality. Provided that a suitable optical data stamping technique can be developed, the high recording sensitivity and ease of manufacture demonstrated here indicate that this material may have potential as a high capacity, low cost media for information storage and distribution.

In accordance with the preceding explanation, variations and adaptations of three-dimensional optical data storage in a fluorescent dye-doped photopolymer in accordance with the present invention will suggest themselves to a practitioner of the optical storage, and optical storage materials, arts.

In accordance with these and other possible variations and adaptations of the present invention, the scope of the invention should be determined in accordance with the following claims, only, and not solely in accordance with that embodiment within which the invention has been taught.

What is claimed is:

1. A homogeneous medium selectively differentiable by selective exposure to radiation, the medium consisting essentially of:
    a binder;
    a liquid monomer contained within said binder, said monomer being photopolymerizable into a solid photopolymer;
    a dye contained within said binder, wherein said monomer is substantially homogeneously doped with said dye;
    wherein said dye is photoexcitable to bind to the photopolymer;

wherein said monomer and said dye are selected and configured such that selective exposure of regions of the medium by radiation provides at least polymerization of said monomer, migration of said dye, and fixing of said dye;

wherein, after the selective exposure, the photopolymerization selectively progressively solidifies the photopolymer, while, simultaneously, molecules of said dye migrate to photopolymerized regions and then become fixed in position by the photopolymer;

wherein, after the selective exposure, a concentration gradient of said dye in the medium from unexposed to exposed regions results due to diffusion of said dye from unexposed to exposed areas;

wherein, after the selective exposure, the medium becomes selectively differentiated in that dye concentration is increased in exposed areas relative to unexposed areas wherein said dye is fluorescent.

2. A homogeneous medium selectively differentiable by selective exposure to radiation, the medium consisting essentially of:

a binder;

a liquid monomer contained within said binder, said monomer being photopolymerizable into a solid photopolymer;

a dye contained within said binder, wherein said monomer is substantially homogeneously doped with said dye;

wherein, said dye is photoexcitable to bind to the photopolymer;

wherein said monomer and said dye are selected and configured such that selective exposure of regions of the medium by radiation provides at least polymerization of said monomer, migration of said dye, and fixing of said dye;

wherein, after the selective exposure, the photopolymerization selectively progressively solidifies the photopolymer, while, simultaneously, molecules of said dye migrate to photopolymerized regions and then become fixed in position by the photopolymer;

wherein, after the selective exposure, a concentration gradient of said dye in the medium from unexposed to exposed regions results due to diffusion of said dye from unexposed to exposed areas;

wherein, after the selective exposure, the medium becomes selectively differentiated in that dye concentration is increased in exposed areas relative to unexposed areas wherein said dye is a photoinitiator of the photopolymerization.

3. The medium according to any one of claims 1 and 2, wherein said dye is selected and configured to bind to the photopolymer at least by chemically attaching to the photopolymer after the selective exposure.

4. The medium according to claim 3 wherein said dye is selected and configured to bind to the photopolymer at least by chemically attaching to the photopolymer after the selective exposure to said monomer;

wherein, after the selective exposure, said dye migrates in accompaniment to said monomer until, and where, said monomer photopolymerizes to the photopolymer.

5. An optical memory system comprising:

a first laser;

a mask, said mask being positioned with respect to said first laser to be illuminated by a laser beam from said first laser;

a 4-f lens system, said 4-f lens system being positioned with respect to said mask so that said mask is imaged through said 4-f lens system; and a homogenous medium according to any one of claims 1 and 2, said medium being positioned with respect to said 4-f lens system to receive an image through said 4-f lens system to a particular depth within said medium.

6. The optical memory system according to claim 5, further comprising:

a rotating diffuser positioned between said first laser and said mask for breaking up spatial coherence of the laser beam and randomizing a diffraction image of the laser beam along its propagation path except when the laser beam is in focus.

7. The optical memory system according to claim 5, further comprising:

a lens disposed in an optical path of said first laser for bringing to a focus the laser beam within said medium.

8. The optical memory system according to claim 7, wherein said detector comprises a CCD.

9. The optical memory system according to claim 5, further comprising:

a shutter means for blocking the laser beam;

a second laser for producing a second laser beam;

a lens for focusing the second laser beam onto selectively exposed regions of the medium after the selective exposure that are at a particular depth within said medium, causing the exposed regions to fluoresce; and a detector of fluorescence from said medium as representing read contents of said medium after the selective exposure;

whereby said medium provides a write-once/read-many optical memory;

whereby the optical memory system is configured to read said medium, providing a write-once/read-many optical memory system.

10. The optical memory system according to claim 9, wherein said lens comprises a cylindrical lens.

* * * * *